US012772895B2

(12) United States Patent
Li

(10) Patent No.: US 12,772,895 B2
(45) Date of Patent: Oct. 20, 2026

(54) SEMICONDUCTOR PACKAGE STRUCTURE, FABRICATING METHOD THEREOF, AND MEMORY SYSTEM

(71) Applicant: YANGTZE MEMORY TECHNOLOGIES CO., LTD., Wuhan (CN)

(72) Inventor: Hui Li, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 506 days.

(21) Appl. No.: 18/206,858

(22) Filed: Jun. 7, 2023

(65) Prior Publication Data

US 2024/0304509 A1 Sep. 12, 2024

(30) Foreign Application Priority Data

Mar. 10, 2023 (CN) ......................... 202310246989.3

(51) Int. Cl.

| | |
|---|---|
| ***H10W 74/10*** | (2026.01) |
| ***H10P 72/70*** | (2026.01) |
| ***H10W 74/01*** | (2026.01) |
| ***H10W 90/00*** | (2026.01) |
| *H10B 80/00* | (2023.01) |

(Continued)

(52) U.S. Cl.

CPC ........... *H10W 74/121* (2026.01); *H10P 72/74* (2026.01); *H10W 72/07552* (2026.01); *H10W 74/01* (2026.01); *H10W 90/00* (2026.01); *H10B 80/00* (2023.02); *H10W 72/07502* (2026.01); *H10W 72/527* (2026.01); *H10W 72/884* (2026.01); *H10W 90/24* (2026.01);

(Continued)

(58) Field of Classification Search

CPC . H01L 23/3135; H01L 21/56; H01L 21/6835; H01L 24/32; H10W 74/121; H10W 74/01; H10W 90/00; H10P 72/74; H10B 80/00

See application file for complete search history.

(56) References Cited

U.S. PATENT DOCUMENTS

| | | | | |
|---|---|---|---|---|
| 9,136,159 | B2 * | 9/2015 | Kelly | H10P 72/0616 |
| 10,269,583 | B2 * | 4/2019 | Luan | H10W 70/093 |

(Continued)

FOREIGN PATENT DOCUMENTS

| | | | | |
|---|---|---|---|---|
| CN | 112349655 A * | 2/2021 | | H10W 90/00 |
| CN | 113013021 A * | 6/2021 | | H10W 95/00 |

(Continued)

*Primary Examiner* — Laura M Menz

(74) *Attorney, Agent, or Firm* — BAYES PLLC

(57) ABSTRACT

The present disclosure provides a semiconductor package structure, a fabricating method thereof, and a memory system. The fabricating method comprises: providing an initial semiconductor package structure comprising: an initial substrate, a die device on the initial substrate and electrically connected with the initial substrate, and an initial package layer on the initial substrate and covers the die device; removing the initial substrate to obtain a die package device including the die device and at least a portion of the initial package layer; attaching a package substrate on the die device and electrically connecting the die device with the package substrate; and forming a first package layer on the package substrate to cover the die package device.

15 Claims, 6 Drawing Sheets

(51) Int. Cl.
*H10W 72/00* (2026.01)
*H10W 72/50* (2026.01)
*H10W 90/24* (2026.01)

(52) U.S. Cl.
CPC ........ *H10W 90/732* (2026.01); *H10W 90/734* (2026.01); *H10W 90/752* (2026.01); *H10W 90/754* (2026.01)

(56) References Cited

U.S. PATENT DOCUMENTS

| | | | | |
|---|---|---|---|---|
| 11,984,378 | B2 * | 5/2024 | Yeh | H10W 40/037 |
| 12,261,092 | B2 * | 3/2025 | Huang | H10P 72/74 |
| 2014/0134804 | A1 * | 5/2014 | Kelly | H10P 72/0616<br>438/118 |
| 2015/0014855 | A1 * | 1/2015 | Yap | H10W 70/09<br>257/773 |
| 2015/0076700 | A1 * | 3/2015 | Yap | H10W 70/09<br>257/773 |
| 2017/0271231 | A1 * | 9/2017 | Iwamoto | H10W 40/10 |
| 2020/0118940 | A1 * | 4/2020 | Vepakomma | H10W 42/121 |
| 2020/0135698 | A1 * | 4/2020 | Hong | H10D 84/038 |
| 2022/0367311 | A1 * | 11/2022 | Yeh | H10W 40/037 |
| 2024/0304509 | A1 * | 9/2024 | Li | H10P 72/74 |
| 2024/0321758 | A1 * | 9/2024 | Chen | H10B 80/00 |
| 2024/0363588 | A1 * | 10/2024 | Wang | H10B 80/00 |
| 2024/0404901 | A1 * | 12/2024 | Xu | H10B 80/00 |
| 2025/0062176 | A1 * | 2/2025 | Wang | H10P 72/74 |
| 2025/0285928 | A1 * | 9/2025 | Lee | H10P 72/74 |
| 2026/0144068 | A1 * | 5/2026 | Lee | H10W 42/121 |

FOREIGN PATENT DOCUMENTS

| | | | | | |
|---|---|---|---|---|---|
| CN | 113178423 | A | * | 7/2021 | H10W 90/00 |
| CN | 112349655 | B | * | 10/2021 | H10W 90/00 |
| CN | 113539983 | A | * | 10/2021 | H10W 70/09 |
| CN | 115312399 | A | * | 11/2022 | H10W 74/117 |
| CN | 118099107 | A | * | 5/2024 | H10W 70/65 |
| CN | 118629877 | A | * | 9/2024 | H10W 90/00 |
| CN | 119833485 | A | * | 4/2025 | H10W 90/00 |
| TW | 201114008 | A | | 4/2011 | |
| TW | 201430968 | A | | 8/2014 | |
| TW | 201810552 | A | | 3/2018 | |
| TW | 202245172 | A | | 11/2022 | |
| TW | 202306080 | A | | 2/2023 | |

* cited by examiner

20

SEMICONDUCTOR PACKAGE STRUCTURE, FABRICATING METHOD THEREOF, AND MEMORY SYSTEM

CROSS-REFERENCE TO RELATED APPLICATIONS

This application claims the benefit of priority to China Patent Application No. 202310246989.3, filed on Mar. 10, 2023, the content of which is incorporated herein by reference in its entirety.

TECHNICAL FIELD

The present disclosure relates to the technical field of semiconductor packaging, and particularly to a semiconductor package structure, a fabricating method thereof, and a memory system.

BACKGROUND

After products (semiconductor package structures) are mass-produced and shipped formally, there is a certain probability that some batch or multiple batches of products are returned in batches due to the reasons such as process drift and packaging process defects and the like of the products. If a large number of products are returned in batches, and returned samples have unique packaging types and cannot be compatible with packaging types of other clients, it means that this batch of products cannot be used on platforms of the other clients either, then the products returned in such cases may only be scrapped, which brings great losses to the company.

SUMMARY

In light of this, the present disclosure provides a semiconductor package structure, a fabricating method thereof, and a memory system, which can achieve batch reuse of returned semiconductor package structures.

To address the above-mentioned problem, the technical solution provided by the present disclosure is as follows.

In a first aspect, the present disclosure provides a fabricating method of a semiconductor package structure, comprising the steps of: providing an initial semiconductor package structure that comprises a die device, an initial substrate and an initial package layer, wherein the die device is located on one side of the initial substrate and electrically connected with the initial substrate, and the initial package layer is located on the initial substrate and clads the die device; removing the initial substrate to obtain a die package device; providing a package substrate, forming the die package device on one side of the package substrate, and electrically connecting the die package device with the package substrate; and forming a first package layer on the package substrate, and enabling the first package layer to clad the die package device.

In some implementations of the present disclosure, the die device is electrically connected with the initial substrate through first connection lines, and the package substrate is located on a side of the initial package layer far away from the initial substrate; the step of electrically connecting the die package device with the package substrate comprises: providing second connection lines, and electrically connecting two ends of the second connection lines with the first connection lines exposed from one side of the die package device and the package substrate respectively; wherein the first package layer further clads the second connection lines.

In some implementations of the present disclosure, the initial package layer comprises a first side far away from the initial substrate, and the die package device comprises the first side and a second side far away from the first side; the step of forming the die package device on one side of the package substrate and electrically connecting the die package device with the package substrate comprises: turning the die package device upside down to enable the second side of the die package device to face away from the package substrate; enabling the first side of the die package device to face the package substrate and to be fixed on the package substrate; and providing second connection lines, and electrically connecting two ends of the second connection lines with the first connection lines exposed from the second side and the package substrate respectively.

In some implementations of the present disclosure, the initial package layer comprises a first side far away from the initial substrate, and the die package device comprises the first side and a second side far away from the first side; the step of forming the die package device on one side of the package substrate and electrically connecting the die package device with the package substrate comprises: enabling the second side of the die package device to face the package substrate and to be fixed on the package substrate; and providing second connection lines, and enabling two ends of the second connection lines to be electrically connected with the first connection lines exposed from the second side and the package substrate respectively.

In some implementations of the present disclosure, the initial semiconductor package structure further comprises a chip structure that is located between the initial substrate and the die device and is electrically connected with the initial substrate; after the step of removing the initial substrate, the fabricating method of the semiconductor package structure further comprises removing the chip structure.

In some implementations of the present disclosure, the chip structure comprises a chip and a first initial adhesive layer, wherein the first initial adhesive layer is formed on the initial substrate and clads the chip, the chip is electrically connected with the initial substrate, and the die device is adhered on the first initial adhesive layer; wherein the step of removing the chip structure comprises: removing the chip and part of the first initial adhesive layer, with the first initial adhesive layer remained on the die device as a residual adhesive layer.

In some implementations of the present disclosure, at the same time as removing the chip structure, the fabricating method further comprises: removing part of the initial package layer, with a remainder of the initial package layer as a second package layer.

In some implementations of the present disclosure, at the same time as the step of removing part of initial package layer, the fabricating method further comprises: removing part of the first connection lines; wherein surfaces of the second package layer, the residual adhesive layer and the first connection lines far away from the package substrate are flush.

In some implementations of the present disclosure, the die device comprises dies that are sequentially disposed in stacks along a stacking direction of the die package device and the package substrate, and there is a connection pad on each of the dies; in the step of turning the die package device upside down to enable the second side of the die package device to face away from the package substrate, the connection pads face the package substrate, and the first connection lines are connected with the connection pads at one end and are connected with the second connection lines at the other end.

In some implementations of the present disclosure, two ends of the second connection lines are electrically connected with the first connection lines exposed from the second side and the package substrate respectively, so that vertical distances from highest points of the second connection lines to the package substrate are greater than a thickness of the die package device in a stacking direction.

In some implementations of the present disclosure, the package substrate is connected with the die package device through a second adhesive layer.

A second aspect of the present disclosure further provides a semiconductor package structure, comprising: a package substrate; a package layer formed on the package substrate; and a die package device comprising a die device and embedded within the package layer; wherein the package layer completely clads the die package device, and the die package device and the package substrate have part of the package layer therebetween, and the die device is electrically connected with the package substrate.

In some implementations of the present disclosure, the die package device further comprises first connection lines that are electrically connected with the die device at one end; the semiconductor package structure further comprises second connection lines, and two ends of the second connection lines are connected with the first connection lines and the package substrate respectively.

In some implementations of the present disclosure, the package layer comprises a first package layer and a second package layer; the die device is embedded within the second package layer; and the die device; and the second package layer are embedded within the first package layer.

In some implementations of the present disclosure, the die package device further comprises a residual adhesive layer that is located on a side of the die device far away from the package substrate and covers the die device, and the package layer clads the residual adhesive layer.

In some implementations of the present disclosure, the die device comprises dies with connection pads on the dies; surfaces of the dies having the connection pads face the package substrate; the first connection lines are connected with the connection pads at one end; and the other end of the first connection lines extends to a direction facing away from the surfaces of the dies having the connection pads and is connected with the second connection lines.

In some implementations of the present disclosure, vertical distances from highest points of the second connection lines to the package substrate are greater than a thickness of the die package device in a stacking direction.

In some implementations of the present disclosure, the surfaces of the dies having the connection pads all face the package substrate.

In some implementations of the present disclosure, the die device further comprises first adhesive layers, and two adjacent ones of the dies are connected through the first adhesive layers; the semiconductor package structure further comprises a second adhesive layer, wherein the package substrate is connected with the die package device through the second adhesive layer; there is a level difference between a surface of the package layer facing the package substrate and a surface of the die package device facing the package substrate; and the second adhesive layer is embedded within a space formed by the level difference between the surface of the package layer facing the package substrate and the surface of the die package device facing the package substrate.

In some implementations of the present disclosure, the die device comprises dies that are sequentially disposed in stacks along a stacking direction of the die package device and the package substrate, and there is a connection pad on each of the dies; surfaces of the dies having the connection pads face away from the package substrate; the first connection lines are connected with the connection pads at one end; and the other end of the first connection lines extends to a direction facing away from the surfaces of the dies having the connection pads and is connected with the second connection lines.

In a third aspect, the present disclosure further provides a memory system, comprising: the above-mentioned semiconductor package structure; and a controller configured to control the semiconductor package structure.

According to the semiconductor package structure, the fabricating method thereof, and the memory system provided by the present disclosure, a new semiconductor package structure capable of being used on the platforms of other clients can be formed by removing the initial substrate of the initial semiconductor package structure (the returned semiconductor package structure) to obtain the die package device, designing a new substrate capable of meeting demands of the other clients, forming the die package device on one side of the package substrate and electrically connecting the die package device with the package substrate and fitting with the packaging process. As such, the batch reuse of the returned semiconductor package structure can be achieved.

BRIEF DESCRIPTION OF THE DRAWINGS

The drawings to be used in the description of implementations will be briefly introduced below in order to illustrate the technical solutions in some implementations of the present disclosure more clearly. Apparently, the drawings described below are only some implementations of the present disclosure. Those skilled in the art may also obtain other drawings according to these drawings without creative work.

DETAILED DESCRIPTION

Figure 1:
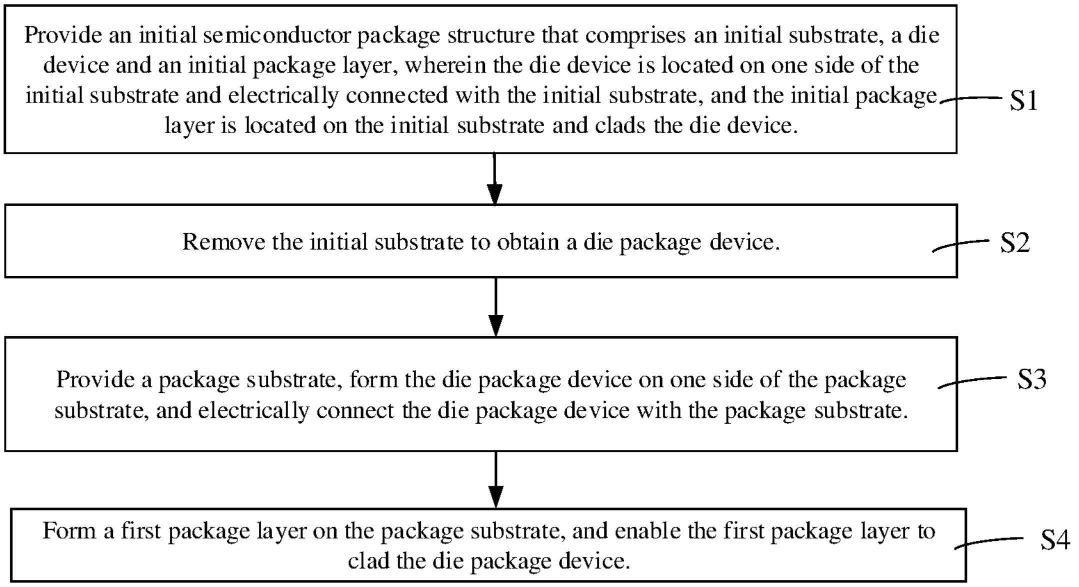
FIG. 1 is a flow diagram of a fabricating method of a semiconductor package structure provided by implementations of the present disclosure.

The technical solutions in some implementations of the present disclosure will be described below clearly and completely in conjunction with the drawings in some implementations of the present disclosure. Apparently, the implementations described are only a part of, but not all of the implementations of the present disclosure. All other implementations obtained by those skilled in the art based on the implementations in the present disclosure without creative work shall fall in the scope of protection of the present disclosure.

In the description of the present disclosure, it is to be understood that orientations or position relationships indicated by the terms “upper”, “lower”, etc. that are based on the orientations or position relationships as shown in the drawings, are only intended to facilitate description of the present disclosure and to simplify the description, instead of indicating or implying that the device or element indicated must have a specific orientation and be configured and operated in a specific orientation, and thus cannot be understood as limiting the present disclosure. Furthermore, the terms “first” and “second” are only for the purpose of description, and cannot be construed as indicating or implying relative importance or implicitly indicating the number of indicated technical features. Thus, features defined by “first” and “second” may explicitly or implicitly include one or more of the features. In the description of the present disclosure, “a plurality of” means two or more, unless otherwise specifically defined.

The present disclosure may repeat the reference numerals and/or reference letters in different implementations, and such repetitions are for the purpose of simplification and clarity, and do not indicate the relationships between various implementations and/or settings as discussed by themselves.

The present disclosure aims at the technical problem that initial semiconductor package structures returned in batches cannot be used on platforms of other clients. A new semiconductor package structure capable of being used on the platforms of the other clients may be formed by removing an initial substrate of the initial semiconductor package structure to obtain a die package device, then designing a new substrate capable of meeting demands of the other clients, forming the die package device on one side of package substrate and electrically connecting the die package device with the package substrate and fitting with the packaging process. As such, the batch reuse of the returned semiconductor package structure can be achieved.

Figure 2A:
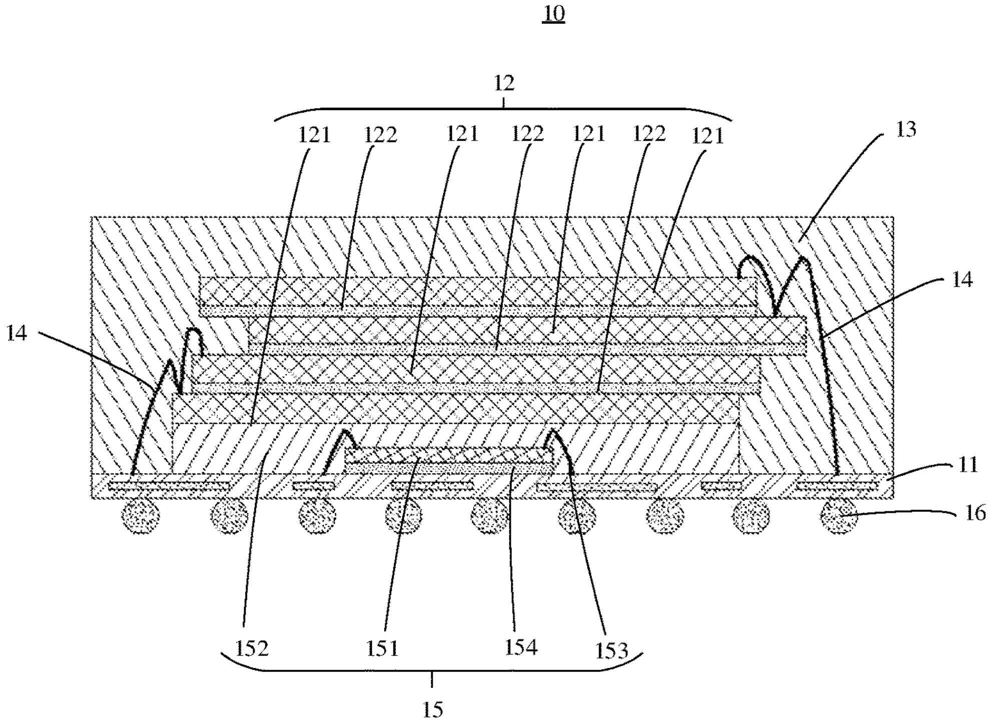
FIGS. 2A and 2B are sectional views of two initial semiconductor package structures provided by some implementations of the present disclosure.
Figure 2B:
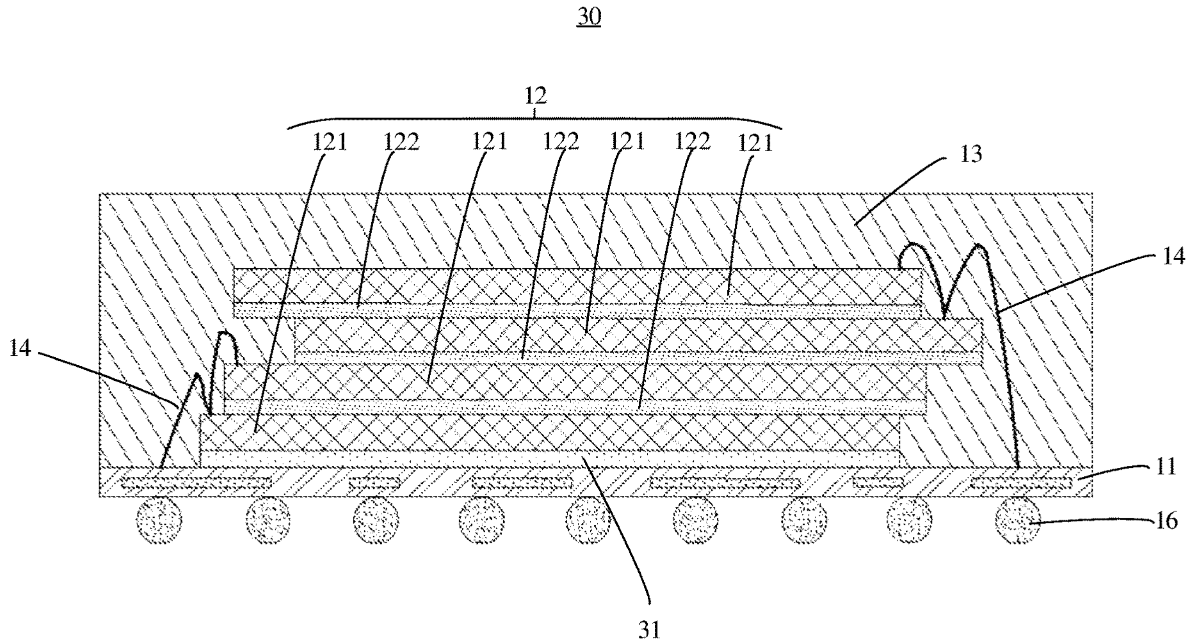

With reference to FIGS. 1 to 7B, some implementations of the present disclosure provide a fabricating method of a semiconductor package structure 100, which comprises:

Step S1: with reference to FIGS. 1-2B, providing an initial semiconductor package structure 10 that comprises an initial substrate 11, a die device 12, and an initial package layer 13, wherein the die device 12 is located on one side of the initial substrate 11 and electrically connected with the initial substrate 11, and the initial package layer 13 is located on the initial substrate 11 and clads the die device 12.

Initial electrical connections 16 are further formed on the initial substrate 11, electrically connected with the initial substrate 11, and located on a side of the initial substrate 11 far away from the die device 12. The initial electrical connections 16 are used to electrically connect with external electronic components.

In the present disclosure, the initial substrate 11 may be either an ordinary carrier substrate, or a substrate with a circuit structure. When the initial substrate 11 is an ordinary carrier substrate, a lead frame to be externally connected with devices is needed on the carrier substrate in order to be electrically connected with the die device 12.

In some implementations of the present disclosure, the die device 12 comprises a plurality of dies 121 and a plurality of first adhesive layers 122 between two adjacent ones of the dies 121, wherein the first adhesive layers 122 are used to adhere two adjacent ones of the dies 121. The dies 121 and the first adhesive layers 122 are alternately stacked together, and a stacking direction of the dies 121 and the first adhesive layers 122 is consistent with a stacking direction of the initial substrate 11 and the die device 12. Two adjacent ones of the dies 121 are disposed in an interleaved manner, and one end of one of the two adjacent dies 121 protrudes out from one end of the other die 121.

In some implementations of the present disclosure, the die device 12 may also comprise only one die 121, and accordingly, the die device 12 does not comprise a first adhesive layer 122.

In some implementations of the present disclosure, there is a connection pad (not numbered in the figures) on each die 121, and surfaces of the dies 121 having the connection pads face away from the initial substrate 11. In other implementations, the surfaces of the dies 121 having the connection pads may also face the initial substrate 11; alternatively, the surfaces of a part of the dies 121 having the connection pads face away from the initial substrate 11, and the surfaces of the other part of the dies 121 having the connection pads face the initial substrate 11.

The die device 12 further comprises first connection lines 14, and is electrically connected with the initial substrate 11 through the first connection lines 14. In particular, the first connection lines 14 are electrically connected with the dies 121 at one end, and electrically connected with the initial substrate 11 at the other end.

In some implementations of the present disclosure, there are multiple first connection lines 14, and part of the dies 121 are connected in series through one first connection line 14, and then electrically connected with the dies being connected in series and the initial substrate 11 through another first connection line 14. The dies 121 being connected in series may be adjacent or may be nonadjacent. In this implementation, the dies 121 being connected in series are two adjacent dies. It is certain that, the number of the dies 121 being connected in series is not limited to two. The dies 121 being connected in series are defined as a set of dies, and then, there may be one or more sets of dies in one die device 12.

The initial package layer 13 clads the dies 121 and the first connection lines 14. In this implementation, the initial package layer 13 further clads the first adhesive layers 122.

The initial package layer 13 comprises a first side 132 far away from the initial substrate 11.

With reference to FIG. 2A, in some implementations of the present disclosure, the initial semiconductor package structure 10 further comprises a chip structure 15 that is located between the die device 12 and the initial substrate 11 and electrically connected with the initial substrate 11. The initial package layer 13 further clads the chip structure 15. The chip structure 15 comprises a chip 151, a first initial adhesive layer 152, third connection lines 153 and a second initial adhesive layer 154, wherein the second initial adhesive layer 154 is located on the initial substrate 11; the chip 151 is located on the second initial adhesive layer 154 and electrically connected with the initial substrate 11 through the third connection lines 153; and the first initial adhesive layer 152 is adhered to the die device 12 and the initial substrate 11 and clads the chip 151, the second initial adhesive layer 154 and the third connection lines 153. The first initial adhesive layer 152 is further adhered to the initial package layer 13.

In some implementations of the present disclosure, the chip 151 may be either a control chip, or other chip without a control function that is directly connected with the initial substrate 11.

With reference to FIG. 2B, in some implementations of the present disclosure, the initial semiconductor package structure 10 does not comprise the chip structure 15, and the die device 12 is directly connected onto the initial substrate 11 through the second initial adhesive layer 154.

Figure 3:
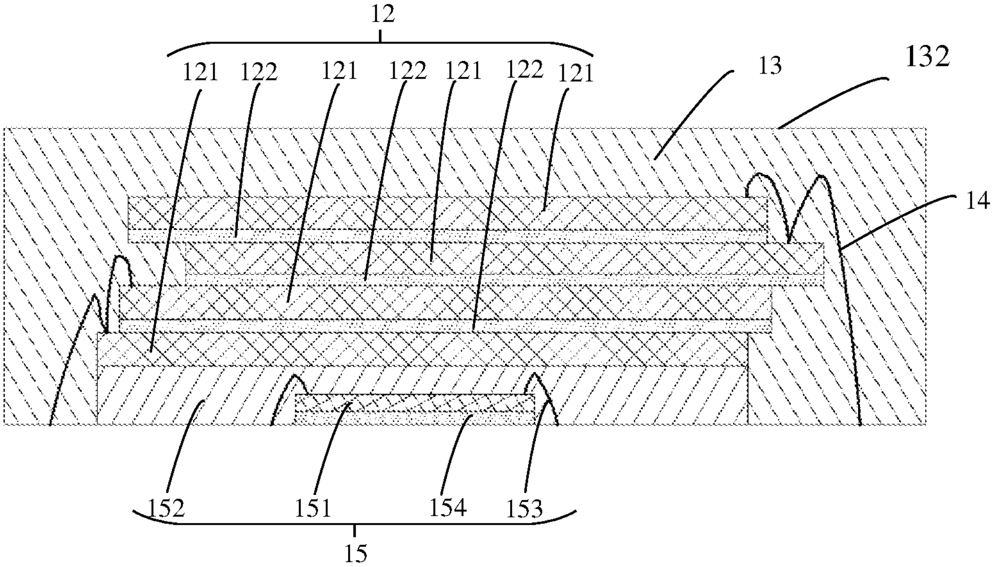
FIG. 3 is a sectional view after removing an initial substrate of an initial semiconductor package structure as shown in FIG. 2A.
Figure 4:
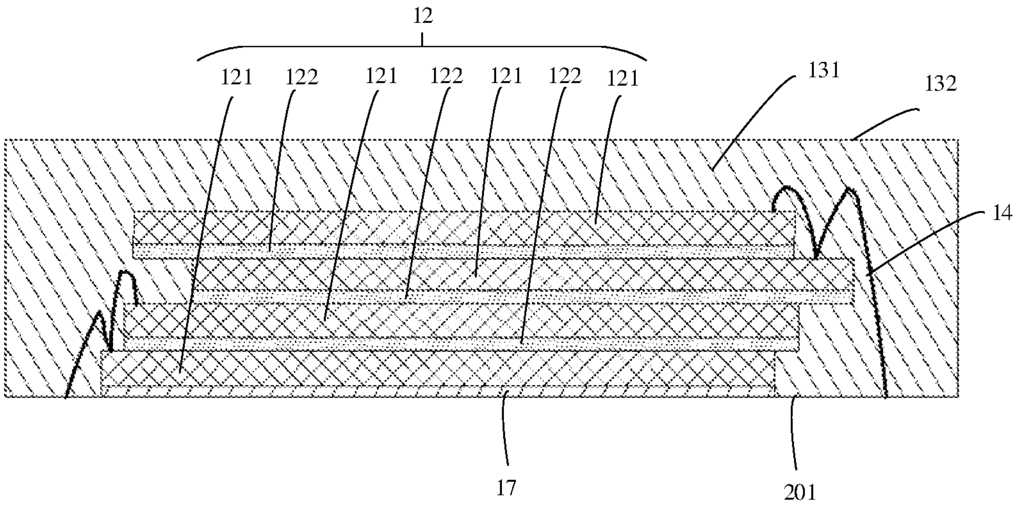
FIG. 4 is a sectional view after obtaining a die package device by removing a chip of an initial semiconductor package structure as shown in FIG. 3 or removing an initial substrate as shown in FIG. 2B.

Step S2: with reference to FIGS. 1 and 3 to 4, removing the initial substrate 11 to obtain a die package device 20.

The die package device 20 comprises a first side 132 and a second side 201 far away from the first side 132.

With reference to FIGS. 2A, 3 and 4, in some implementations of the present disclosure, since the initial semiconductor package structure 10 further comprises the chip structure 15, in Step S2, after removing the initial substrate 11, the fabricating method further comprises the step of: removing the chip structure 15.

The step of removing the chip structure 15 comprises: removing the chip 151, the second initial adhesive layer 154 and at least part of the first initial adhesive layer 152.

In this implementation, part of the first initial adhesive layer 152 is remained on the die package device 20, and the first initial adhesive layer 152 remained on the die package device 20 is a residual adhesive layer 17. In other implementations, the first initial adhesive layer 152 may also be removed completely.

A function of the residual adhesive layer 17 is to protect the dies 121 against wearing in a process of removing the chip structure 15 or removing the chip structure 15 and the initial substrate 11.

At the same time as "removing the chip structure 15", the fabricating method further comprises: removing part of the initial package layer 13, wherein a remainder of the initial package layer 13 is a second package layer 131.

The second side 201 comprises a surface of the second package layer 131 far away from the first side 132 and a surface of the residual adhesive layer 17 far away from the first side 132.

In some implementations of the present disclosure, the surface of the second package layer 131 far away from the first side 132 is flush with the surface of the residual adhesive layer 17 far away from the first side 132. That is, the second side 201 is a plane.

At the same time as "removing part of the initial package layer 13", the fabricating method further comprises the step of: removing part of the first connection lines 14.

The surfaces of the second package layer 131, the residual adhesive layer 17 and the first connection lines 14 far away from the first side 132 are flush.

With reference to FIG. 2B, in some other implementations of the present disclosure, the initial semiconductor package structure 30 is similar to the initial semiconductor package structure 10 in structure, except that the initial semiconductor package structure 30 does not comprise a chip structure 15. After removing the initial substrate 11, the chip structure 15 is not required to be removed, but part of the initial package layer 13 will be removed.

In some other implementations of the present disclosure, the chip structure 15, the initial substrate 11 and part of the initial package layer 13 are removed by a mechanical polishing process or a mechanical polishing process in conjunction with a wet or dry etching process.

Step S3: with reference to FIGS. 1 and 5 to 6B, providing a package substrate 19, forming the die package device 20 on one side of the package substrate 19, and electrically connecting the die package device 20 with the package substrate 19.

In particular, the die package device 20 is connected to a side of the package substrate 19 facing the die package device 20 through a second adhesive layer 21.

In some implementations of the present disclosure, the package substrate 19 may be either an ordinary carrier substrate, or a substrate with a circuit structure. When the package substrate 19 is an ordinary carrier substrate, a lead frame to be externally connected with devices is needed on the carrier substrate in order to be electrically connected with the die device 12.

Figure 5:
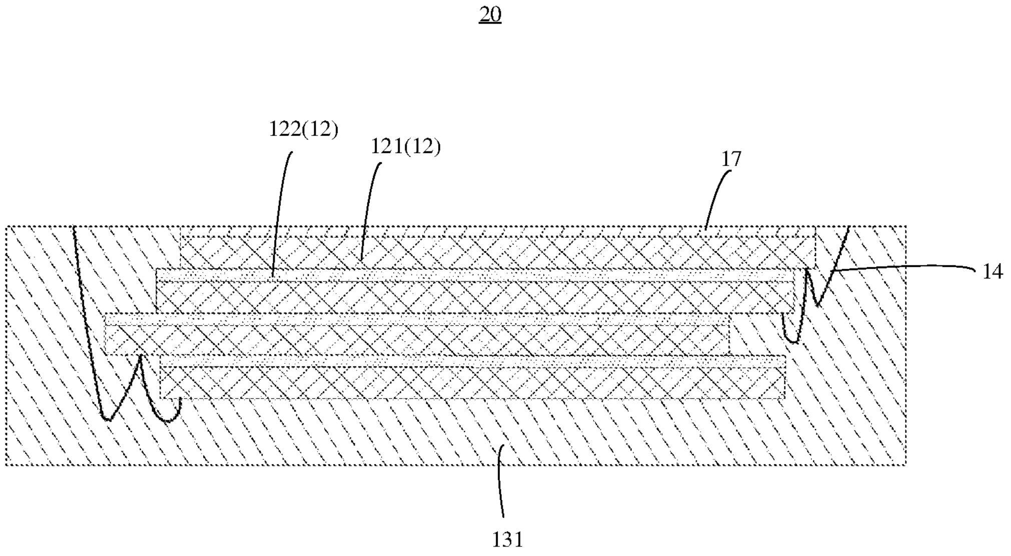
FIG. 5 is a sectional view of a die package device as shown in FIG. 4 after being flipped 1800.
Figure 6A:
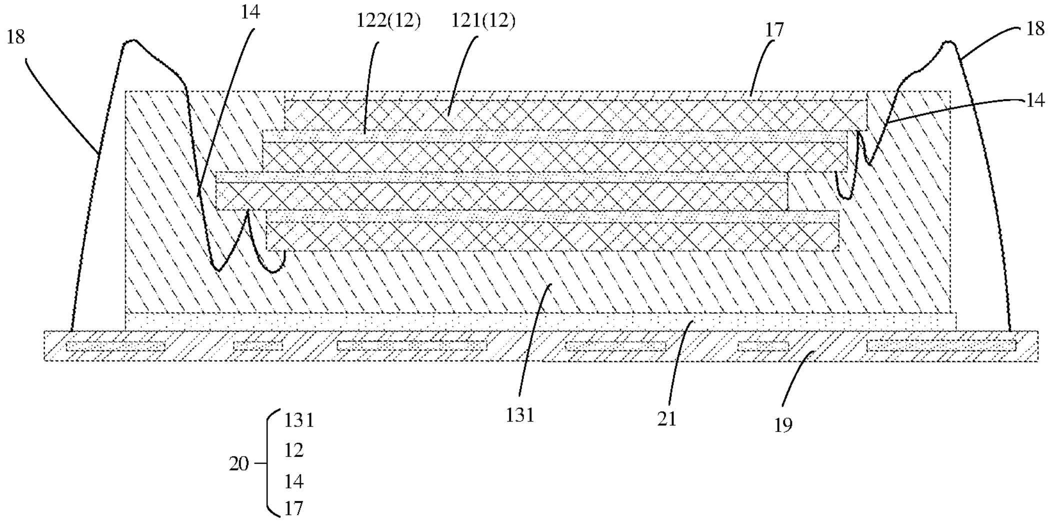
FIG. 6A is a sectional view after forming a flipped die package device as shown in FIG. 5 on one side of a substrate.

With reference to FIGS. 1, 2A, 5 and 6A, in some implementations of the present disclosure, the step of "forming the die package device 20 on one side of the package substrate 19, and electrically connecting the die package device 20 with the package substrate 19" comprises: firstly, with reference to FIG. 5, turning the die package device 20 upside down to enable the second side 201 of the die package device 20 to be far away from the package substrate 19; secondly, with reference to FIG. 6A, enabling the first side 132 of the die package device 20 to face the package substrate 19 and to be fixed on the package substrate 19; and thirdly, with reference to FIG. 6A, providing second connection lines 18 and electrically connecting two ends of the second connection lines 18 with the first connection lines 14 exposed from the second side 201 of the die package device 20 and the package substrate 19 respectively.

With reference to FIG. 6A, in some implementations of the present disclosure, the second side 201 of the die package device 20 faces the package substrate 19. Vertical distances from highest points of the second connection lines 18 to the package substrate 19 are greater than a thickness of the die package device 20 in a stacking direction. That is, lengths of the second connection lines 18 are greater than a vertical distance from a side of the die package device 20 far away from the package substrate 19 to the substrate, so that it can be avoided that the second connection lines 18 are easily detached from the first connection lines 14 due to the overtightened second connection lines 18, thereby ensuring connection firmness between the second connection lines 18 and the first connection lines 14.

In particular, the first connection lines 14 are connected with the connection pads of the die package device 20 at one end and connected with the second connection lines 18 at the other end. Accordingly, in this implementation, the connection pads of the die package device 20 face the package substrate 19.

Figure 6B:
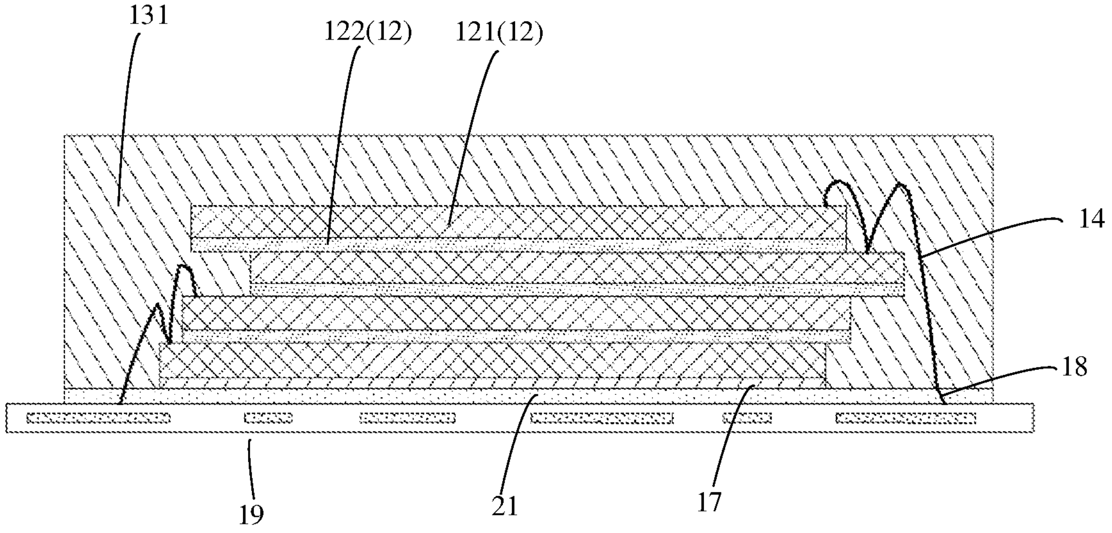
FIG. 6B is a sectional view after forming a die package device as shown in FIG. 4 on one side of a substrate.

With reference to FIGS. 1, 4 and 6B, in some other implementations of the present disclosure, at the step of "forming the die package device 20 on one side of the package substrate 19", the die package device 20 may also be not turned upside down, and the die package device 20 is directly disposed on the package substrate 19 through the second adhesive layer 21, and at this point, the residual adhesive layer 17 is adhered to the second adhesive layer 21. Accordingly, the first side 132 of the die package device 20 faces the package substrate 19, and the lengths of the second connection lines 18 in FIG. 6B are shorter than the lengths of the second connection lines 18 in FIG. 6A.

Figure 7A:
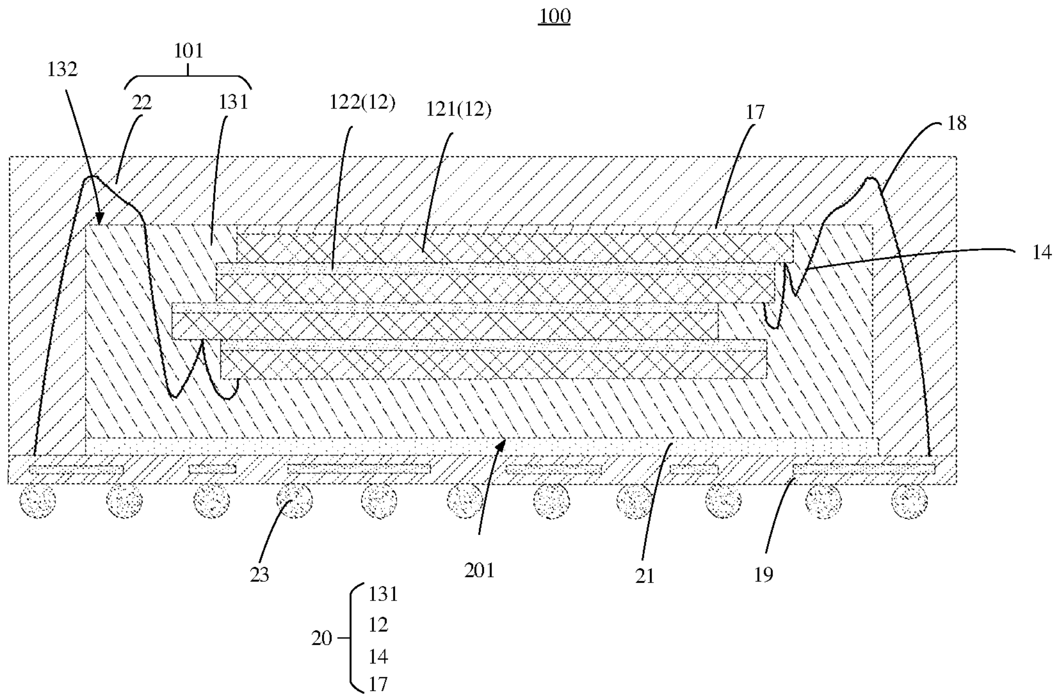
FIG. 7A is a sectional view of a semiconductor package structure obtained by forming a first package layer cladding a die package device on a substrate as shown in FIG. 6A.
Figure 7B:
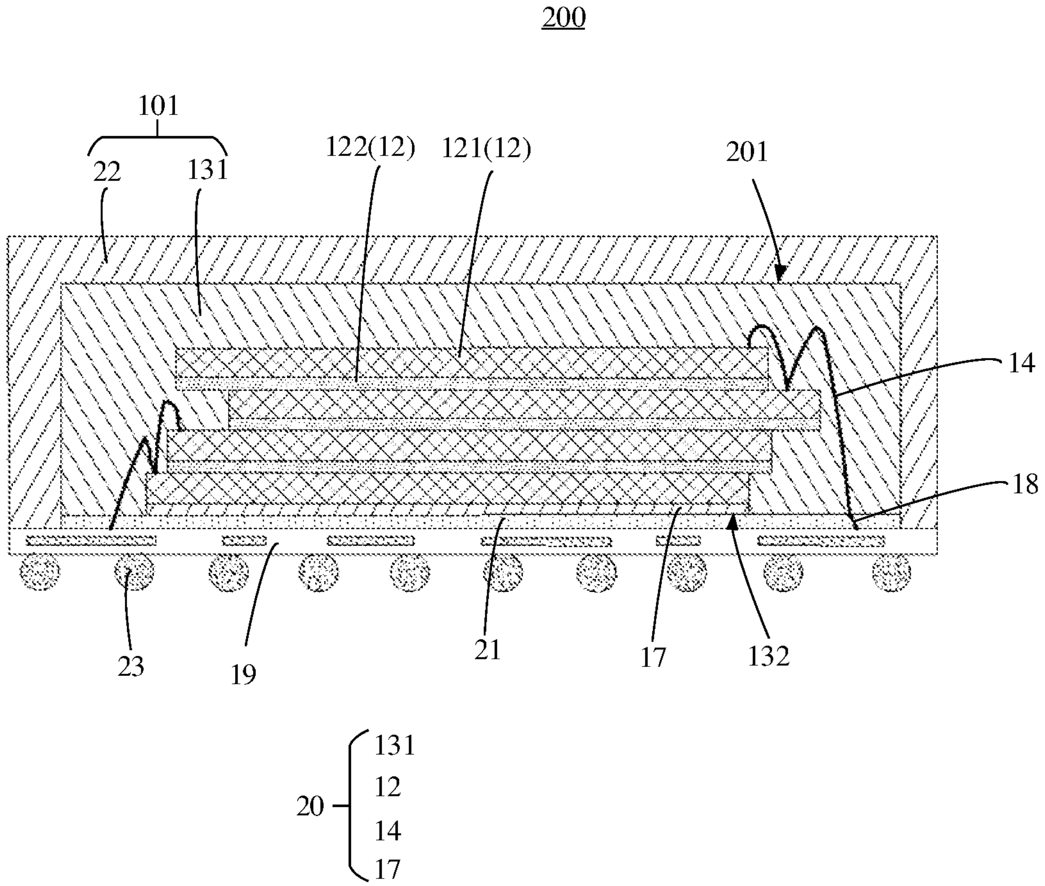
FIG. 7B is a sectional view of a semiconductor package structure obtained by forming a first package layer cladding a die package device on a substrate as shown in FIG. 6B.

Step S4: with reference to FIGS. 1, 7A and 7B, forming a first package layer 22 on the package substrate 19, and enabling the first package layer 22 to clad the die package device 20.

The first package layer 22 further clads the second connection lines 18 and the second adhesive layer 21 to protect the second connection lines 18 and improve connection firmness of the semiconductor package structure 100.

It is certain that, after Step S4, the fabricating method further comprises the step of: forming a plurality of package electrical connections 23 electrically connected with the package substrate 19 respectively on a side of the package substrate 19 far away from the die package device 20. The package electrical connections 23 may be or may not be protected by a protection layer.

It is certain that, after Step S4, the fabricating method may further comprise other steps for fabricating the semiconductor package structure, and these steps may be set according to actual situations, which is not repeated herein.

The fabricating method of the semiconductor package structure of the present disclosure can form a new semiconductor package structure capable of being used on the platforms of other clients by removing the initial substrate of the initial semiconductor package structure (the returned semiconductor package structure) to obtain the die package device, designing a new substrate capable of meeting demands of other clients, forming the die package device on one side of the package substrate and electrically connecting the die package device with the package substrate and fitting with the packaging process. As such, the batch reuse of the returned semiconductor package structure can be achieved.

With reference to FIG. 7A, some implementations of the present disclosure further provide a semiconductor package structure 100 that comprises a package substrate 19, a package layer 101 and a die package device 20, wherein the package layer 101 is formed on the package substrate 19, and the die package device 20 comprises a die device 12 and is embedded within the package layer 101. The package layer 101 completely clads the die package device 20; the die package device 20 and the package substrate 19 have part of the package layer 101 therebetween; and the die package device 20 is electrically connected with the package substrate 19.

In particular, the package layer 101 comprises a first package layer 22 and a second package layer 131; the die device 12 is embedded within the second package layer 131, and the die device 12 and the second package layer 131 are embedded within the first package layer 22.

In particular, the die device 12 comprises a plurality of dies 121 and a plurality of first adhesive layers 122 between two adjacent ones of the dies 121. The first adhesive layers 122 are used to adhere two adjacent ones of the dies 121. The dies 121 and the first adhesive layers 122 are alternately stacked together, and a stacking direction of the dies 121 and the first adhesive layers 122 is consistent with a stacking direction of the initial substrate 11 and the die device 12. Two adjacent ones of the dies 121 are disposed in an interleaved manner, and one end of one of the two adjacent dies 121 protrudes out from one end of the other die 121.

The die device 12 further comprises a residual adhesive layer 17 that is located on a side of one die 121 far away from the package substrate 19 that is the one farthest away from the package substrate 19; a surface of the residual adhesive layer 17 far away from the package substrate 19 is flush with a surface of the second package layer 131 far away from the package substrate 19; and the surface of the residual adhesive layer 17 far away from the package substrate 19 and the surface of the second package layer 131 far away from the package substrate 19 are in contact with the first package layer 22.

The die device 12 further comprises a first side 132 and a second side 201 far away from the first side 132. The first side 132 comprises a surface of the second package layer 131 far away from the residual adhesive layer 17, and the second side 201 comprises a surface of the second package layer 131 far away from the first side 132, and a surface of the residual adhesive layer 17 far away from the first side 132. The first side 132 of the die device 12 is in contact with the first package layer 22, and the second side 201 of the die device 12 and a surface of the first package layer 22 in contact with the package substrate 19 have a level difference therebetween.

In particular, the die package device 20 is connected to a side of the package substrate 19 facing the die package device 20 through a second adhesive layer 21. The second adhesive layer 21 is located in a space formed by the level difference between the second side 201 of the die device 12 and the surface of the first package layer 22 in contact with the package substrate 19.

In some implementations of the present disclosure, the die device 12 may also comprise only one die 121, and accordingly, the die device 12 does not comprise a first adhesive layer 122.

The die device 12 further comprises first connection lines 14 and second connection lines 18, and is electrically connected with the package substrate 19 through the first connection lines 14 and the second connection lines 18. In particular, the first connection lines 14 are electrically connected with the dies 121 at one end, and electrically connected with one end of the second connection lines 18 at the other end, and the other end of the second connection lines 18 is electrically connected with the package substrate 19.

In some implementations of the present disclosure, there are multiple first connection lines 14, and part of the dies 121 are connected in series through one first connection line 14, and then electrically connected with the dies being connected in series and the initial substrate 11 through another first connection line 14. The dies 121 being connected in series may be adjacent or may be nonadjacent. In this implementation, the dies 121 being connected in series are two adjacent dies. It is certain that, the number of the dies 121 being connected in series is not limited to two. The dies 121 being connected in series are defined as a set of dies, and then, there may be one or more sets of dies in one die device 12.

In some implementations of the present disclosure, the second side 201 of the die package device 20 faces the package substrate 19. Vertical distances from highest points of the second connection lines 18 to the package substrate 19 are greater than a thickness of the die package device 20 in a stacking direction. That is, lengths of the second connection lines 18 are greater than a vertical distance from a side of the die package device 20 far away from the package substrate 19 to the substrate, so that it can be avoided that the second connection lines 18 are easily detached from the first connection lines 14 due to the overtightened second connection lines 18, thereby ensuring connection firmness between the second connection lines 18 and the first connection lines 14.

In some implementations of the present disclosure, there is a connection pad (not numbered in the figures) on each die

121, and the first connection lines 14 are connected with the connection pads of the die package device 20 at one end and are connected with the second connection lines 18 at the other end. Accordingly, in this implementation, the connection pads of the die package device 20 face the package substrate 19. The first package layer 22 further clads the second connection lines 18 and the second adhesive layer 21 to protect the second connection lines 18 and improve connection firmness of the semiconductor package structure 100.

There are also a plurality of package electrical connections 23 electrically connected with the package substrate 19 on a side of the package substrate 19 far away from the die package device 20. The package electrical connections 23 may be or may not be protected by a protection layer. The package electrical connections 23 are used to externally connect with electronic components.

With reference to FIG. 7B, some implementations of the present disclosure further provide a semiconductor package structure 200 which is similar to the semiconductor package structure 100 in structure, except that: the second side 201 of the die package device 20 is in contact with the first package layer 22; the first side 132 of the die package device 20 is adhered together with the package substrate 19 through the second adhesive layer 21; the connection pads of the die package device 20 are located on a side of the dies 121 far away from the package substrate 19; the second adhesive layer 21 clads the second connection lines 18; and lengths of the second connection lines 18 in FIG. 7B are shorter than those of the second connection lines 18 in FIG. 7A.

Figure 8:
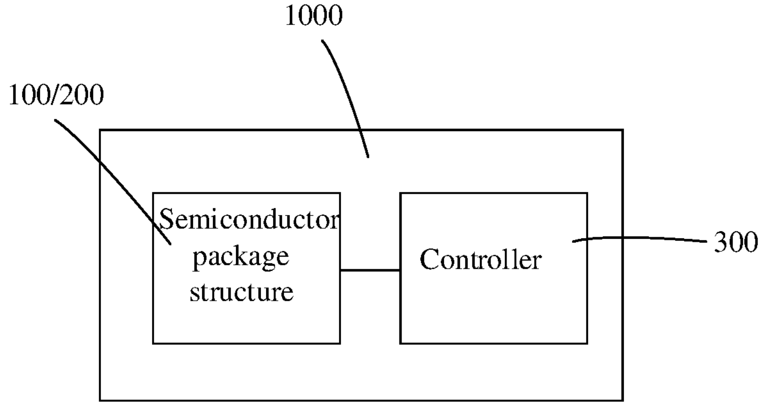
FIG. 8 is a module schematic diagram of a memory system provided by the present disclosure.

With reference to FIG. 8, the present disclosure further provides a memory system 1000 which comprises one or more semiconductor package structures 100 or 200 as described above and a controller 300, wherein the controller 300 is located within or external to package layers 101 of the semiconductor package structures 100 or 200, and configured to control the semiconductor package structures 100 or 200.

When the controller 300 is located within the package layers 101 of the semiconductor package structures 100 or 200, the semiconductor package structures 100 or 200 may be considered as also having functions of the controller 300. When the controller 300 is located external to the package layers 101 of the semiconductor package structures 100 or 200, the semiconductor package structures 100 or 200 may be considered as not having functions of the controller 300, and are independent of the controller 300.

The memory system 1000 may be a mobile phone, a desktop computer, a laptop computer, a tablet computer, a vehicle computer, a gaming console, a printer, a positioning apparatus, a wearable electronic apparatus, a smart sensor, a Virtual Reality (VR) apparatus, an Augmented Reality (AR) apparatus, or any other suitable electronic apparatuses having memories therein. The controller may be configured to control operations of the semiconductor package structures, such as reading, erasing, and programming operations.

In some implementations, the controller is designed for operating in a low duty-cycle environment such as Secure Digital (SD) cards, Compact Flash (CF) cards, Universal Serial Bus (USB) flash drives, or other media for use in electronic apparatuses, such as personal computers, digital cameras, mobile phones, etc.

In some implementations, the controller is designed for operating in high duty-cycle environment Solid-State Disks (SSDs) or Embedded Multi Media Cards (eMMCs) used as data memories for mobile apparatuses, such as smartphones, tablets, laptop computers, etc., and enterprise memory arrays.

According to the semiconductor package structure, the fabricating method thereof, and the memory system provided by the present disclosure, a new semiconductor package structure capable of being used on the platforms of other clients can be formed by removing the initial substrate of the initial semiconductor package structure (the returned semiconductor package structure) to obtain the die package device, designing a new substrate capable of meeting demands of the other clients, forming the die package device on one side of the package substrate and electrically connecting the die package device with the package substrate and fitting with the packaging process. As such, the batch reuse of the returned semiconductor package structure can be achieved.

To sum up, although the present disclosure has been disclosed as above with preferred implementations, the above preferred implementations are not used to limit the present disclosure. Those of ordinary skill in the art may make various changes and modifications without departing from the spirits and scope of the present disclosure. Therefore, the protection scope of the present disclosure shall be defined by the claims.

What is claimed is:

1. A semiconductor package structure, comprising:

a package substrate;

a first package layer formed on the package substrate;

second connection lines embedded in the first package layer;

a die package device comprising:

a second package layer, a die device located in the second package layer, a residual adhesive layer on a first side of the die device away from the package substrate, and sandwiched between the first package layer and the die device;

first connection lines embedded in the second package layer, electrically connected between the die device and the second connection lines;

wherein the first connection lines and the second connection lines are connected with each other at an interface between the first package layer and the second package layer;

a vertical distance from a highest point of the second connection lines to the package substrate is greater than a thickness of the die package device in a stacking direction; and wherein the first package layer completely covers the die package device, and the die device is electrically connected with the package substrate.

2. The semiconductor package structure of claim 1, wherein the second connection lines are electrically connected between the first connection lines and the package substrate.

3. The semiconductor package structure of claim 1, wherein the die device comprises:

a plurality of dies stacked with each other by first adhesive layers; and a plurality of connection pads on each of the plurality of dies and electrically connected with the first connection lines.

4. The semiconductor package structure of claim 3, wherein:

the plurality of connection pads face the package substrate;

the second package layer is attached to package substrate by a second adhesive layer.

5. The semiconductor package structure of claim 3, further comprising:

a residual adhesive layer on a second side of the die device adjacent to the package substrate; and a second adhesive layer sandwiched between the package substrate and the die device;

wherein the residual adhesive layer is in contact with the adhesive layer.

6. The semiconductor package structure of claim 5, wherein:

the second connection lines are embedded in the second adhesive layer; and the plurality of connection pads face away the package substrate.

7. A semiconductor package structure, comprising:

a package substrate;

a first package layer formed on the package substrate;

second connection lines embedded in the first package layer;

a die package device comprising:

a second package layer, a die device located in the second package layer, a residual adhesive layer on a first side of the die device away from the package substrate, and sandwiched between the first package layer and the die device;

first connection lines embedded in the second package layer, electrically connected with the die device, and connected to the second connection lines at an interface between the first package layer and the second package layer;

wherein a vertical distance from a highest point of the second connection lines to the package substrate is greater than a thickness of the die package device in a stacking direction; and wherein the first package layer completely covers the die package device, and the die device is electrically connected with the package substrate.

8. The semiconductor package structure of claim 7, wherein the second connection lines are electrically connected between the first connection lines and the package substrate.

9. The semiconductor package structure of claim 7, wherein the die device comprises:

a plurality of dies stacked with each other by first adhesive layers; and a plurality of connection pads on each of the plurality of dies and electrically connected with the first connection lines.

10. The semiconductor package structure of claim 9, wherein:

the plurality of connection pads face the package substrate;

the second package layer is attached to package substrate by a second adhesive layer.

11. The semiconductor package structure of claim 9, further comprising:

a residual adhesive layer on a second side of the die device adjacent to the package substrate; and a second adhesive layer sandwiched between the package substrate and the die device;

wherein the residual adhesive layer is in contact with the adhesive layer.

12. The semiconductor package structure of claim 11, wherein:

the second connection lines are embedded in the second adhesive layer; and the plurality of connection pads face away the package substrate.

13. A semiconductor package structure, comprising:

a package substrate;

a first package layer formed on the package substrate;

second connection lines embedded in the first package layer;

a die package device comprising:

a second package layer, a die device located in the second package layer, a residual adhesive layer on a first side of the die device away from the package substrate, and sandwiched between the first package layer and the die device;

first connection lines embedded in the second package layer, electrically connected between the die device and the second connection lines, the first connection lines and the second connection lines are connected with each other at an interface between the first package layer and the second package layer;

wherein the first package layer completely covers the die package device, and a vertical distance from a highest point of the second connection lines to the package substrate is greater than a thickness of the die package device in a stacking direction.

14. The semiconductor package structure of claim 13, wherein the die device is electrically connected with the package substrate through the first connection lines and the second connection lines.

15. The semiconductor package structure of claim 13, wherein the die device comprises:

a plurality of dies stacked with each other by first adhesive layers; and a plurality of connection pads on each of the plurality of dies and electrically connected with the first connection lines.

* * * * *